(12) United States Patent
Moriguchi et al.

(10) Patent No.: US 8,389,108 B2
(45) Date of Patent: Mar. 5, 2013

(54) SURFACE COATED CUTTING TOOL

(75) Inventors: Hideki Moriguchi, Itami (JP); Makoto Setoyama, Itami (JP); Miki Miyanaga, Itami (JP); Junya Okida, Itami (JP); Sachiko Koike, Itami (JP); Daiji Tabayashi, Itami (JP)

(73) Assignees: Sumitomo Electric Industries, Ltd., Osaka (JP); Sumitomo Electric Hardmetal Corp., Hyogo (JP)

( * ) Notice: Subject to any disclaimer, the term of this patent is extended or adjusted under 35 U.S.C. 154(b) by 305 days.

(21) Appl. No.: 12/740,564

(22) PCT Filed: Apr. 24, 2009

(86) PCT No.: PCT/JP2009/058152
§ 371 (c)(1),
(2), (4) Date: Apr. 29, 2010

(87) PCT Pub. No.: WO2009/133814
PCT Pub. Date: Nov. 5, 2009

(65) Prior Publication Data
US 2010/0260561 A1 Oct. 14, 2010

(30) Foreign Application Priority Data

Apr. 30, 2008 (JP) ................................. 2008-119040

(51) Int. Cl.
B32B 7/02 (2006.01)

(52) U.S. Cl. ........ 428/212; 428/216; 428/215; 428/698; 428/908.8; 409/119

(58) Field of Classification Search ........................ None
See application file for complete search history.

(56) References Cited

U.S. PATENT DOCUMENTS

| 6,299,658 B1 * | 10/2001 | Moriguchi et al. ............. 51/307 |
| 2009/0297835 A1 * | 12/2009 | Okada et al. .................. 428/336 |
| 2011/0114474 A1 * | 5/2011 | Bae et al. ................. 204/192.15 |

FOREIGN PATENT DOCUMENTS

| EP | 1 764 174 A1 | 3/2007 |
| EP | 1 825 943 A1 | 8/2007 |
| JP | 5-116003 A | 5/1993 |

(Continued)

OTHER PUBLICATIONS

International Search Report for PCT/JP2009/058152, dated Jun. 23, 2009, pp. 1-5.

(Continued)

Primary Examiner — Jennifer McNeil
Assistant Examiner — Daniel J Schleis
(74) Attorney, Agent, or Firm — Ditthavong Mori & Steiner, P.C.

(57) ABSTRACT

A surface-coated cutting tool of the present invention includes a substrate and a coated layer formed on the substrate, and the coated layer is a physical-vapor-deposition layer having a thickness of 10 μm or more. A surface region having a thickness of 1 μm from a surface of the coated layer includes a first region whose integrated residual stress is a compressive stress and a second region whose integrated residual stress is a tensile stress, and the integrated residual stress of the surface region falls within the range of −1.5 to 1.5 GPa in any region included in the surface region.

20 Claims, 2 Drawing Sheets

FOREIGN PATENT DOCUMENTS

| | | |
|---|---|---|
| JP | 9-323204 A | 12/1997 |
| JP | 2001-62603 A | 3/2001 |
| JP | 2005-187927 A | 7/2005 |
| JP | 2006-62074 A | 3/2006 |
| JP | 2006-82218 A | 3/2006 |
| JP | 2007-526135 A | 9/2007 |
| KR | 1999-0082572 A | 11/1999 |
| KR | 2007-0085526 A | 8/2007 |
| KR | 2007-0105614 A | 10/2007 |
| WO | WO 98/27241 A1 | 6/1998 |
| WO | WO 2005/085499 A1 | 9/2005 |
| WO | WO 2006/064724 A1 | 6/2006 |
| WO | WO2006064724 * | 6/2006 |
| WO | WO 2009/133814 A1 | 11/2009 |

OTHER PUBLICATIONS

Office Action for related Korean Patent Application No. 10-2010-7006138 dated Aug. 24, 2012, pp. 1-10.

Extended European Search Report for EP 09 73 8751 dated Jul. 26, 2012, pp. 1-6.

* cited by examiner

SURFACE COATED CUTTING TOOL

CROSS-REFERENCE TO RELATED APPLICATION

The present application is a national phase application of PCT Application No. PCT/JP2009/058152, filed on Apr. 24, 2009, and claims priority to Japanese Application No. JP 2008-119040, filed on Apr. 30, 2008, the entire contents of which are herein incorporated by reference.

TECHNICAL FIELD

The present invention relates to surface-coated cutting tools including substrates and coated layers formed on the substrates.

BACKGROUND ART

A variety of cutting tools are widely used for cutting of metal materials. For example, chemical-vapor-deposition (CVD) tools, physical-vapor-deposition (PVD) tools, cermet tools, cemented carbide tools, and ceramic tools are available and used depending on applications. Of these, CVD tools are tools having coated layers (ceramic coatings) formed on substrates by CVD and PVD tools are tools having coated layers (ceramic coatings) formed on substrates by PVD, whereas cermet tools, cemented carbide tools, and ceramic tools can be classified as tools having no such coated layers.

Recently, CVD tools and PVD tools have increasingly been used with increasing cutting speed. CVD tools are mainly used as turning tools for steel because alumina films, generally having both superior peeling resistance and superior heat resistance, can be formed thereon. PVD tools, on the other hand, are mainly used as milling cutters, which are exposed to large mechanical impacts, because they have a compressive residual stress in the coated layers and therefore have superior breakage resistance.

Nowadays, there is a growing demand for high-speed, high-efficiency machining to improve hourly productivity in the cutting industry, and accordingly the film thickness of CVD tools has been increasing (that is, thicker coated layers have been formed). CVD tools, however, have a problem in that a large tensile residual stress occurs in a coated layer such as an alumina film or a TiCN film due to the difference in coefficient of thermal expansion between the substrate and the coated layer if the film thickness is increased to about 15 μm, thus decreasing the film strength, and also increases the surface roughness of the film, thus decreasing the peeling resistance of the film. Therefore, after the coated layer is formed by CVD, the coated layer is subjected to surface treatment such as blasting or polishing (Japanese Unexamined Patent Application Publication No. 05-116003 (Patent Document 1)). However, it is difficult to release the tensile residual stress of the entire coated layer formed by CVD, and it is therefore difficult to stabilize the breakage resistance of a thick-film CVD tool including a coated layer having a thickness of 15 μm or more.

PVD tools, on the other hand, ensure superior cutting performance in turning applications involving intense mechanical impacts, such as interrupted cutting, because a compressive residual stress can be applied to a coated layer formed by PVD. Accordingly, a cutting tool has been proposed that includes a coated layer whose compressive residual stress distribution is adjusted to improve wear resistance and resistance to chipping (Japanese Unexamined Patent Application Publication No. 2006-082218 (Patent Document 2)). For this proposal, however, it is difficult to form a coated layer having a thickness of 10 μm or more without a film failure because the coated layer has a large compressive residual stress. Accordingly, a PVD tool has been proposed that includes a coated layer formed to a thickness of about 10 μm by PVD so as to have a particular orientation (Japanese Unexamined Patent Application Publication No. 09-323204 (Patent Document 3)). This proposal, however, has a limited range of application because the type of coated layer is limited to one having a particular composition and a particular crystal orientation, and even if the coated layer can be formed without a film failure, a phenomenon by which a compressive failure occurs in the coated layer under an impact upon cutting cannot be sufficiently prevented, with the result that an extended tool life is demanded. In particular, the development of a thick-film PVD tool superior in wear resistance to a CVD tool including a coated layer having a thickness of 15 μm or more has been demanded.

PRIOR ART DOCUMENTS

Patent Documents

Patent Document 1: Japanese Unexamined Patent Application Publication No. 05-116003
Patent Document 2: Japanese Unexamined Patent Application Publication No. 2006-082218
Patent Document 3: Japanese Unexamined Patent Application Publication No. 09-323204

DISCLOSURE OF INVENTION

Problems to be Solved by the Invention

An object of the present invention, which has been made in light of the current circumstances described above, is to provide a surface-coated cutting tool including a thick coated layer formed by PVD so that it has superior wear resistance and a reduced susceptibility to a failure in the coated layer during the formation of the coated layer or during cutting.

Means for Solving the Problems

A surface-coated cutting tool of the present invention includes a substrate and a coated layer formed on the substrate, and the coated layer is a physical-vapor-deposition layer having a thickness of 10 μm or more. A surface region having a thickness of 1 μm from a surface of the coated layer includes a first region whose integrated residual stress is a compressive stress and a second region whose integrated residual stress is a tensile stress, and the integrated residual stress of the surface region falls within the range of −1.5 to 1.5 GPa in any region included in the surface region.

Here the integrated residual stress of the entire coated layer is preferably −1 to less than 0 GPa, and the integrated residual stress of the second region is preferably 1 GPa or less.

In addition, the coated layer preferably has a thickness of 15 μm or more, and more preferably has a thickness of 20 μm or more.

In addition, preferably, the coated layer includes one or more layers, and at least one of the layers is formed of a nitride, carbonitride, oxynitride, or oxycarbonitride containing at least titanium as a constituent. In addition, at least part of the coated layer preferably includes a super-multilayered structure.

In addition, preferably, the substrate is formed of a cemented carbide, the cemented carbide contains WC crystal grains, and the crystal grains have an average grain size of 0.3 to 2.5 μm.

In addition, crystal grains contained in the coated layer preferably are coherent with the WC crystal grains contained in the substrate in an interfacial region between the substrate and the coated layer.

The above surface-coated cutting tool of the present invention is suitable for use in turning.

Advantages

With the above configuration, the surface-coated cutting tool of the present invention has superior wear resistance and a reduced susceptibility to a failure in the coated layer during the formation of the coated layer or during cutting.

BEST MODES FOR CARRYING OUT THE INVENTION

Figure 1:
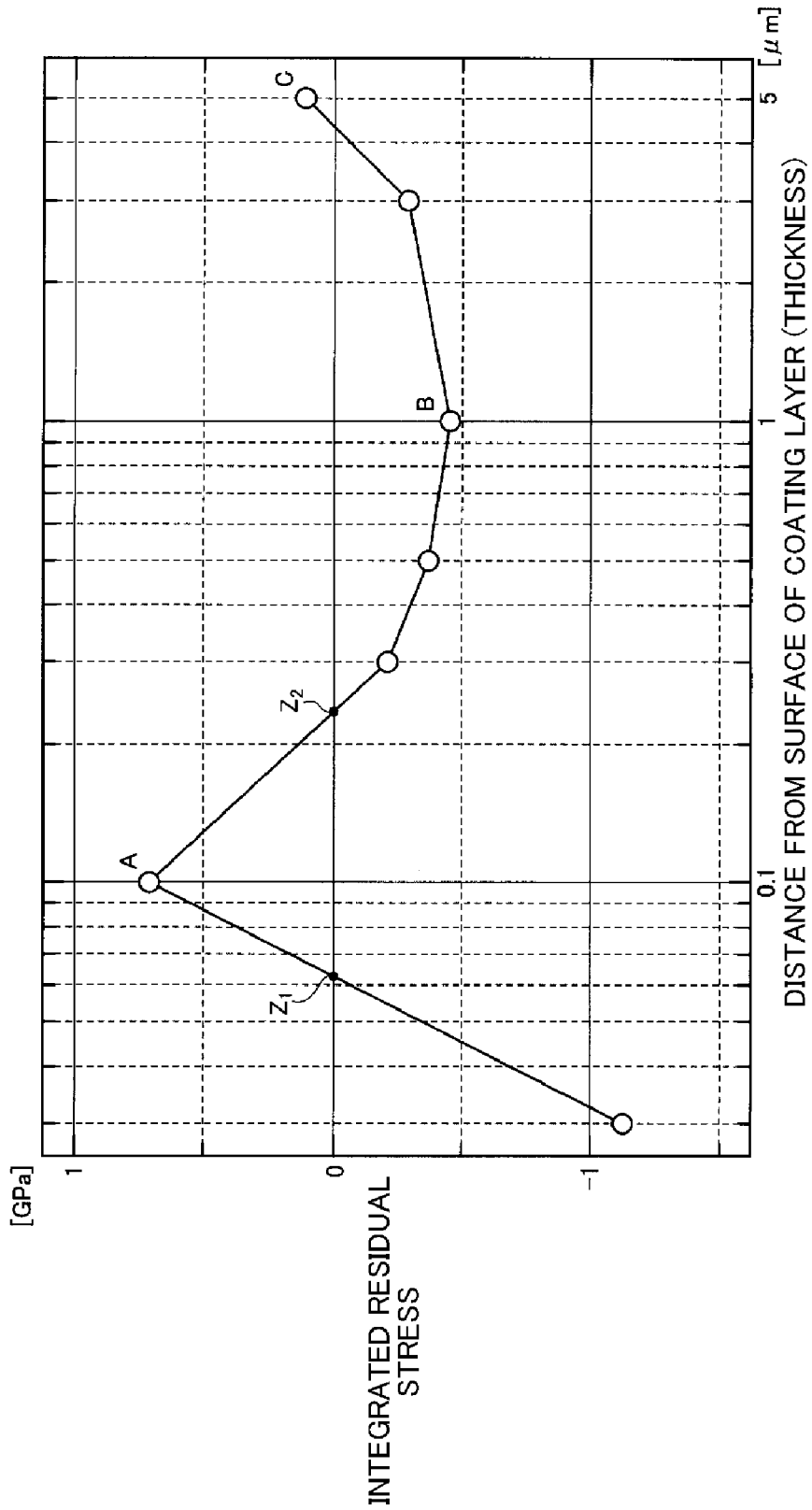
FIG. 1 is a graph showing an example of the integrated residual stress of a surface region of a coated layer of the present invention.

The present invention will now be described in more detail.

Surface-Coated Cutting Tool

A surface-coated cutting tool of the present invention includes a substrate and a coated layer formed on the substrate. The surface-coated cutting tool of the present invention, thus configured, is significantly valuable for use as, for example, a drill, an end mill, a indexable insert for milling or turning, a metal saw, a gear-cutting tool, a reamer, a tap, or a tip for crankshaft pin milling.

While the surface-coated cutting tool of the present invention can thus be used for a variety of applications, it is particularly suitable for use in turning applications where CVD tools have been mainly used. That is, the surface-coated cutting tool of the present invention serves as an alternative to conventional thick-film CVD tools in turning applications and is significantly effective for use in high-speed, high-efficiency machining because it has a longer tool life than the thick-film CVD tools.

Substrate

The substrate used for the surface-coated cutting tool of the present invention can be any substrate known conventionally as a substrate for such cutting tools. Examples of such substrates include cemented carbides (for example, WC-based cemented carbides, including those containing cobalt in addition to WC, to which, for example, a carbonitride of titanium, tantalum, niobium, or the like may be further added), cermets (those mainly containing, for example, TiC, TiN, or TiCN), high-speed steels, ceramics (such as titanium carbide, silicon carbide, silicon nitride, aluminum nitride, aluminum oxide, and mixtures thereof), sintered cubic boron nitride compacts, and sintered diamond compacts.

In particular, a cemented carbide is preferred as the substrate of the present invention, and a cemented carbide containing WC crystal grains having an average grain size of 0.3 to 2.5 μm is particularly suitable for use as the substrate. The average grain size is more preferably 0.4 to 2 μm, still more preferably 0.5 to 1.5 μm.

Typically, a cemented carbide used as a substrate of a CVD tool for steel turning contains WC crystal grains having an average grain size of 3 to 5 μm. Because a coated layer formed by CVD has a tensile residual stress, cracks are introduced in the coated layer during the production process, and the cracks, corresponding to the thickness of the coated layer, are introduced in advance. For this reason, the grain size of the WC crystal grains is large, namely, 3 to 5 μm, as shown above, for improved crack propagation resistance. In contrast, there is little need to improve the crack propagation resistance of a coated layer formed by PVD, as in the present invention, because it contains no cracks in principle. On the contrary, if the average grain size falls within the range of 0.3 to 2.5 μm, the hardness of the substrate can be increased for improved wear resistance, and the strength thereof can also be increased to ensure superior breakage resistance. In addition, if the average grain size of the WC crystal grains falls within the above range, the crystal grains forming the coated layer can grow at the interface between the substrate and the coated layer so as to be coherent with the WC crystal grains, as described later, with the result that the coated layer includes finer grains for improved adhesion to the cemented carbide substrate. Thus, the cutting tool achieves superior peeling resistance. The average grain size of the WC crystal grains is determined by counting the number of WC crystal grains present on any line segment of predetermined length (line segment parallel to the surface of the substrate) in the surface of the substrate (in the interfacial region with the coated layer) using a scanning electron microscope or a crystal orientation analyzer and then dividing the length of the WC crystal grains present within the predetermined length by the count. The predetermined length of the line segment under measurement is preferably about 2 to 100 μm, more preferably about 5 to 50 μm. This is because such a length is sufficient to avoid an error and represent the value of the entire substrate.

The cemented carbide containing the WC crystal grains having such an average grain size can be produced by pulverizing and mixing, as raw materials, WC powder, cobalt powder, and optionally at least one powder selected from the group consisting of $Cr_3C_2$ powder, VC powder, NbC powder, TiC powder, TaC powder, and so on, each powder having an average grain size of 0.1 to 2.5 μm, in ethanol in a predetermined mixing ratio, compacting the mixed powder by pressing after drying, and sintering the compact in a vacuum at a high temperature, namely, around 1,400° C.

In the case where the substrate used is a cemented carbide, the advantages of the present invention are realized even if the cemented carbide contains free carbon or an abnormal phase called η phase in its structure.

The surface of the substrate used in the present invention may be modified. For example, a β-phase-free layer may be formed on the surface of a cemented carbide, or a surface-hardened layer may be formed on the surface of a cermet. The advantages of the present invention are realized even if the surface is modified.

Coated Layer

The coated layer formed on the substrate of the surface-coated cutting tool of the present invention is a physical-vapor-deposition layer having a thickness of 10 μm or more. A physical-vapor-deposition layer herein refers to a coating formed by physical vapor deposition (PVD). The PVD process used in the present invention can be any conventionally known PVD process. Examples of such PVD processes include sputtering, arc ion plating, and evaporation. In particular, arc ion plating and magnetron sputtering are preferably used.

The coated layer of the present invention is characterized in that it has a thickness of 10 μm or more. With a thickness of 10 μm or more, the coated layer improves the wear resistance to significantly extend the tool life. In the present invention, a thick physical-vapor-deposition layer having a thickness of 10 μm or more can be formed because of the control of integrated residual stress, as described later.

The coated layer of the present invention preferably has a thickness of 15 μm or more, more preferably 20 μm or more. This further extends the tool life and provides superior breakage resistance. It is evident that the coated layer of the present invention is superior to a CVD coated layer having a similar thickness because it has a lower breakage resistance due to the difficulty in releasing its tensile stress.

In the present invention, the thickness of the coated layer refers to the thickness of the coated layer at a cutting edge, for example, the thickness of the coated layer, formed on the substrate of the surface-coated cutting tool, at a cutting edge of a rake face.

Integrated Residual Stress

Figure 2:
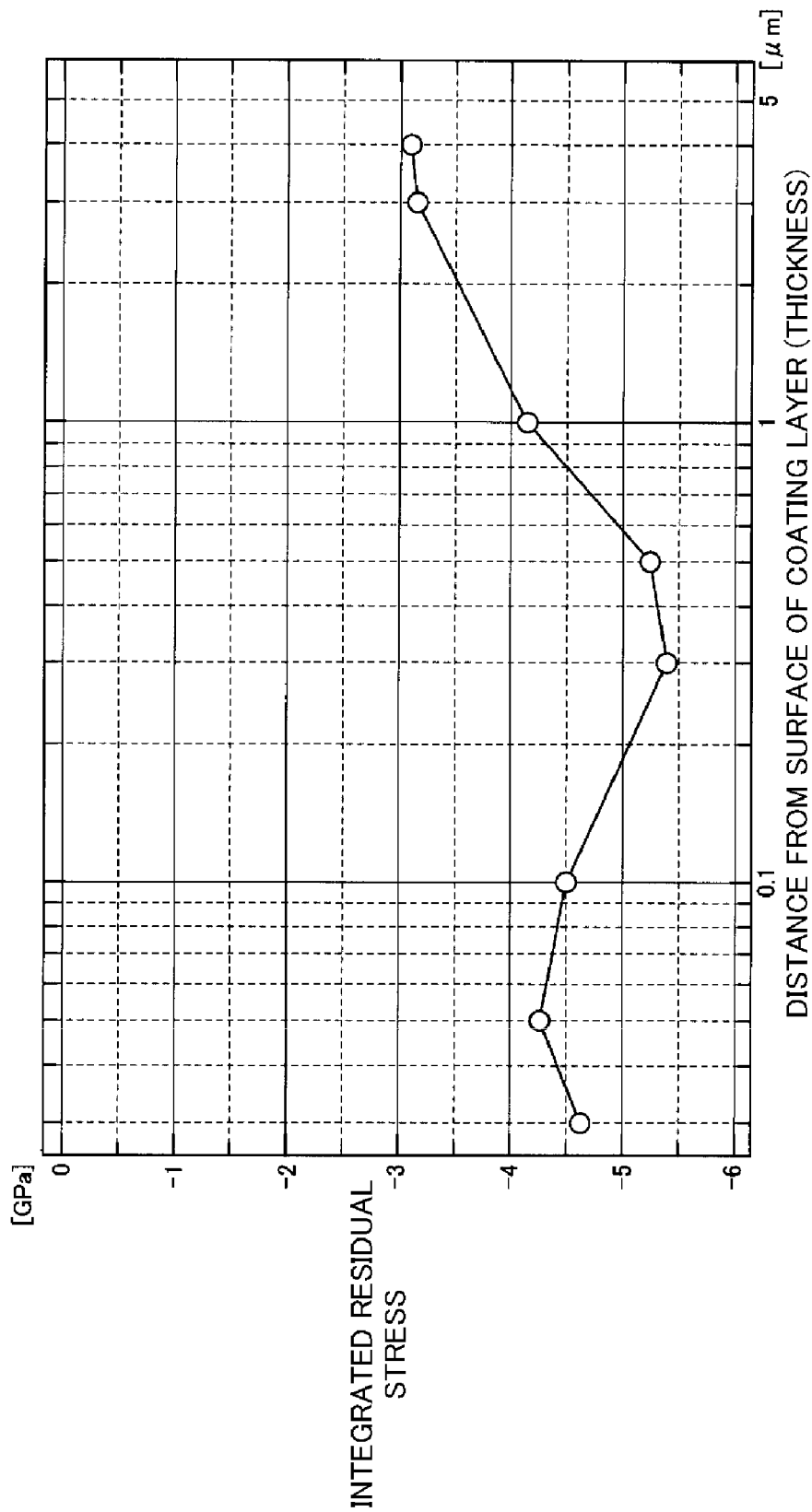
FIG. 2 is a graph showing an example of the integrated residual stress of a surface region of a conventional coated layer.

In the present invention, a region having a thickness of 1 μm from the surface of the coated layer (that is, a region from the surface to a depth of 1 μm) is referred to as a surface region. The surface region is required to include a first region whose integrated residual stress is a compressive stress and a second region whose integrated residual stress is a tensile stress. The surface region may include each of the first and second regions as a single region such that the surface region is divided in two, or may include each as two or more regions physically isolated from each other. Taking FIG. 1, described later, as an example, the first region includes two regions, namely, a region from the surface of the coated layer to $Z_1$ and a region from $Z_2$ to a thickness of 1 μm (that is, regions having integrated residual stresses below 0 GPa), whereas the second region is a region from $Z_1$ to $Z_2$ (that is, a region having an integrated residual stress of 0 GPa or more). The details of FIG. 1 will be described later. On the other hand, FIG. 2 is a graph showing an example of the integrated residual stress of a surface region of a coated layer of a conventional surface-coated cutting tool (having a physical-vapor-deposition layer formed on a substrate), where the integrated residual stress is a compressive stress over the entire surface region, as opposed to FIG. 1, which shows the surface region of the coated layer of the present invention.

Thus, the coated layer of the present invention, including the first and second regions, can be provided as a physical-vapor-deposition layer having the property of suffering no failure during the formation (in the present invention, the formation of the coated layer is to be understood to include a cooling step after the coating step) or during cutting, even though it has a thickness of 10 μm or more. This is based on the finding by the present inventor that the control of residual stress at the surface portion of the coated layer is most effective for stable use of a thick physical-vapor-deposition layer for cutting such as turning. That is, resistance to both a tensile failure and a compressive failure is required to achieve the above property, and if a region whose integrated residual stress is a tensile stress and a region whose integrated residual stress is a compressive stress are both present in the surface portion of the coated layer, they can resist a complicated stress field occurring during the formation of the coated layer or during cutting, thus providing sufficient resistance to both a compressive failure and a tensile failure.

The integrated residual stress of the first region is preferably −1.5 GPa or more, more preferably −1 GPa or more. If the integrated residual stress of the first region falls within the above range, it can prevent a compressive failure significantly effectively even if the coated layer has a thickness of 10 μm or more. In addition, the integrated residual stress of the second region is preferably 1 GPa or less, more preferably 0.8 GPa or less. If the integrated residual stress of the second region falls within the above range, it can prevent a tensile failure significantly effectively even if the coated layer has a thickness of 10 μm or more.

In the present invention, an integrated residual stress refers to the average residual stress from the surface of the coated layer to a certain point in the depth direction. This will be further described below using FIG. 1. FIG. 1 is a graph showing an example of the integrated residual stress of the surface region of the coated layer of the present invention. In FIG. 1, point A, for example, indicates a point 0.1 μm apart from the surface of the coated layer (that is, a point at a thickness of 0.1 μm), meaning that the residual stress from the surface to that point averages 0.7 GPa (it does not mean that the residual stress at point A alone is 0.7 GPa). Hence, the integrated residual stress at point A is 0.7 GPa. Similarly, the integrated residual stress at point B (point at a thickness of 1 μm) is −0.45 GPa, and the integrated residual stress at point C (point at a thickness of 5 μm) is 0.12 GPa, although point C is not included in the surface region.

In the present invention, additionally, a compressive stress (compressive residual stress) is a type of internal stress (inherent strain) present in the coated layer and is expressed as a negative value (in GPa). In the present invention, on the other hand, a tensile stress (tensile residual stress) is a type of internal stress present in the coated layer and is expressed as a positive value (in GPa). Because both a compressive stress and a tensile stress are internal stresses remaining in the coated layer, they may be simply collectively referred to as a residual stress (including 0 GPa for convenience).

In the present invention, additionally, the integrated residual stress of the surface region is required to fall within the range of −1.5 to 1.5 GPa in any region included in the surface region. If the integrated residual stress of the surface region falls below −1.5 GPa, a compressive failure tends to occur, whereas if the integrated residual stress of the surface region exceeds 1.5 GPa, a tensile failure may occur; in either case, the tool life is shortened. Here "the integrated residual stress of the surface region falls within the range of −1.5 to 1.5 GPa in any region included in the surface region", taking FIG. 1 above as an example for illustration, means that the integrated residual stress does not fall below −1.5 GPa or exceed 1.5 GPa at any point in the surface region (region having a thickness of 1 μm from the surface).

The integrated residual stress of the surface region preferably falls within the range of −1 to 1 GPa, particularly preferably −0.8 to 0.8 GPa.

In addition, the integrated residual stress of the entire coated layer of the present invention is preferably −1 to less than 0 GPa. This is because the property of suffering no failure during the formation of the coated layer or during cutting while having superior breakage resistance can be effectively realized. Here "the integrated residual stress of the entire coated layer is −1 to less than 0 GPa" means that the residual stress of the entire coated layer averages −1 to less than 0 GPa. The integrated residual stress of the entire coated layer is more preferably −0.8 to less than 0 GPa, still more preferably −0.7 to less than 0 GPa. Thus, if the integrated residual stress of the entire coated layer is a small compressive residual stress (small in the absolute value of the stress), it is possible not only to improve the peeling resistance of the coated layer, which would otherwise spall easily from the substrate because of its large thickness, namely, 10 μm or more, but also to improve resistance to both a compressive failure and a tensile failure, thus enhancing the effect of extending the tool life.

In the present invention, the integrated residual stress can be measured by the $\sin^2 \psi$ method. The $\sin^2 \psi$ method, which uses X-rays, is widely used as a method for measuring the residual stresses of polycrystalline materials. This measurement method is described in detail in "X-Sen Oryoku Sokuteiho (X-ray Stress Measurement Method)" (The Society of Materials Science, Japan, published by Yokendo Co., Ltd., 1981), pages 54 to 66. In the present invention, with the depth of penetration of X-rays fixed by combining the iso-inclination method and the side-inclination method, the diffraction angle $2\theta$ is measured in various $\psi$ directions in a plane including the direction of the stress to be measured and the normal to the surface of a sample at a measurement position, thereby creating a $2\theta$-$\sin^2 \psi$ graph whose gradient can be used to determine the average of the residual stress up to that depth (distance from the surface of the coated layer).

More specifically, in an X-ray stress measurement method in which an X-ray from an X-ray source is incident on a sample at a predetermined angle and the X-ray diffracted by the sample is detected by an X-ray detector to measure the internal stress on the basis of the detected value, an X-ray from an X-ray source is incident at any position on the surface of a sample at any preset angle. While the sample is rotated about the $\omega$ axis, which passes through the point of X-ray irradiation on the sample and which is perpendicular to the incident X-ray in the surface of the sample, and the x axis, on which the $\omega$ axis coincides with the incident X-ray as the $\omega$ axis is rotated parallel to the sample stage, with the angle between the surface of the sample and the incident X-ray remaining constant, diffraction lines are measured with varying angles $\psi$ between the normal to the diffraction plane and the normal to the surface of the sample, thereby determining the internal residual stress of the sample.

The X-ray source used is preferably synchrotron radiation (SR) in terms of the quality (such as high luminance, high parallelism, and wavelength tunability) of the X-ray source.

In addition, the Young's modulus and the Poisson's ratio of the coated layer are needed to determine the residual stress from a $2\theta$-$\sin^2 \psi$ graph as above. It is possible, however, to measure the Young's modulus using, for example, a dynamic hardness tester, and the Poisson's ratio used may be a value around 0.2 because it does not vary largely depending on the type of material.

Composition of Coated Layer

The coated layer formed on the substrate of the surface-coated cutting tool of the present invention includes one or more layers. That is, the coated layer may be formed only of a layer having a single composition or may be formed of two or more layers having different compositions. If the coated layer is formed of two or more layers, the layer composition may be different or the same at the interface between the surface region described above and the other region. Similarly, the layer composition may be different or the same at the interface between the first and second regions described above. Thus, in the present invention, the strength distribution of the integrated residual stress and the distribution of the composition may be correlated or uncorrelated. The coated layer of the present invention is not limited to one covering the entire surface of the substrate, but may be partially missing.

The coated layer is formed in order to provide the effect of improving various properties, including the wear resistance, the oxidation resistance, and the toughness of the tool and coloration for identifying a used cutting edge, and the composition used is not particularly limited and can be a conventionally known one. For example, the composition can be exemplified by one formed of a carbide, nitride, oxide, carbonitride, oxycarbide, oxynitride, or oxycarbonitride, or a solid solution thereof, of at least one element selected from the group consisting of Group IVA elements (such as titanium, zirconium, and hafnium), Group VA elements (such as vanadium, niobium, and tantalum), Group VIA elements (such as chromium, molybdenum, and tungsten), aluminum (Al), boron (B), and silicon (Si) in the periodic table of the elements. A coated layer containing nitrogen is preferred because it has superior toughness and is resistant to a failure even if it is thick. A carbonitride is preferred for its crater resistance, whereas an oxide is preferred for its superior oxidation resistance and adhesion resistance. The composition can also be one formed only of at least one of the above elements.

Particularly preferred among the above compositions is a nitride, carbonitride, oxynitride, or oxycarbonitride containing at least titanium as a constituent. That is, at least one layer of the coated layer of the present invention is preferably formed of a nitride, carbonitride, oxynitride, or oxycarbonitride containing at least titanium as a constituent. This is because the above compound is particularly superior in resistance to adhesion to steel and wear resistance.

Preferable examples of the composition of the above compound include nitrides, carbonitrides, oxynitrides, and oxycarbonitrides of titanium, $(Ti_{1-x}Al_x)$, $(Ti_{1-x}Cr_x)$, $(Ti_{1-x}Mo_x)$, $(Ti_{1-x}Zr_x)$, $(Ti_{1-x}Si_x)$, $(Ti_{1-x}Hf_x)$, $(Ti_{1-x}Nb_x)$, $(Ti_{1-x}W_x)$, and $(Ti_{1-x-y}Al_xSi_y)$ (where x and y are any numbers of 1 or less) (including those further containing, for example, boron or chromium). In the above, the atomic ratios of nitrogen, oxygen, and carbon are not particularly limited and can be conventionally known ones.

More preferable examples of such compounds include TiCN, TiN, TiSiN, TiSiCN, TiHfN, TiAlN, TiAlCrN, TiAlSiN, TiAlSiCrN, TiBN, TiAlBN, TiSiBN, TiBCN, TiAlBCN, and TiSiBCN. The atomic ratios of these compositions follow those of the above examples of general formulas. In the present invention, any conventionally known atomic ratio can be selected for the chemical formulas of other compounds unless otherwise specified.

In addition, at least part of the coated layer preferably includes a super-multilayered structure. A super-multilayered structure herein refers to a laminate of about 100 to 10,000 layers of two or more types having different properties or compositions (typically, laminated alternately on top of each other), each having a thickness of several nanometers to several hundreds of nanometers. In this case, different targets are simultaneously used for coating. This is preferable because layers advantageous in terms of deposition speed and having different properties or compositions can be combined to improve the film properties of the coated layer, such as hardness, heat insulation, and oxidation resistance.

Interfacial Region Between Substrate and Coated Layer

The crystal grains contained in the coated layer of the surface-coated cutting tool of the present invention preferably are coherent with the WC crystal grains contained in the substrate in the interfacial region between the substrate and the coated layer. Here "are coherent with the WC crystal grains contained in the substrate" means that in the interfacial region the individual crystal grains contained in the coated layer are formed as columnar crystals on the individual WC crystal grains so that the widths of the individual columnar crystals substantially agree with the sizes of the individual WC crystal grains. The WC crystal grains preferably have an average grain size of 0.3 to 2.5 μm, as described above, and accordingly the columnar crystal grains of the coated layer have a width of 0.3 to 2.5 μm.

Thus, if the crystal grains contained in the coated layer are coherent with the WC crystal grains contained in the substrate in the interfacial region between the substrate and the coated layer, the coated layer has improved adhesion to the substrate to deliver superior performance particularly for turning applications requiring peeling resistance.

Method for Forming Coated Layer

Because the coated layer of the present invention is a physical-vapor-deposition layer, it is formed by physical vapor deposition (PVD). The coated layer can be formed by any PVD process, and the type of the formation process is not particularly limited.

In addition, a study by the present inventor has demonstrated that the integrated residual stress, described above, applied to the coated layer depends on, for example, the substrate temperature and the substrate bias voltage at which the coated layer is formed and radiation heat from a heater, and they can be controlled to apply the integrated residual stress described above.

In general, as a higher substrate bias voltage is applied to the substrate, the elements that are to form the coated layer are supplied as ions to the substrate with a higher energy and therefore collide with larger impacts, with the result that the coated layer formed will have a larger compressive stress (larger in the absolute value of the negative stress). Conversely, as the substrate bias voltage is lower, the elements collide as ions with the substrate with smaller impacts, with the result that a smaller compressive stress (smaller in the absolute value of the negative stress) will be applied, or in some cases, a tensile stress will be applied.

In addition, as the substrate temperature during the formation is lower, the compressive stress introduced by impacts resulting from collision of the elements as ions with the substrate is less easily annealed by heat, with the result that the coated layer formed will have a larger compressive stress (larger in the absolute value of the negative stress). Conversely, as the substrate temperature during the formation or the heater temperature after the formation is higher, the compressive stress introduced by impacts resulting from collision of the elements as ions with the substrate is more easily annealed by heat, with the result that a smaller compressive stress (smaller in the absolute value of the negative stress) will be applied, or in some cases, a tensile stress will be applied.

To form the surface region of the coated layer, for example, in the step of forming the last 1 μm region (which serves as the surface region) following the formation of the coated layer at a substrate (base member) bias voltage at which a compressive stress can be introduced, the desired first and second regions can be formed by temporarily raising the substrate temperature to a temperature at which a tensile stress can be introduced in the coated layer and then cooling the substrate to a temperature at which a compressive stress can be introduced in the coated layer, or by employing a method such as deposition at a reduced bias voltage.

In the formation of the surface region of the coated layer, additionally, if the substrate bias voltage, the substrate temperature, and the on/off state of the heater are controlled to maintain a balance between the introduction of the compressive stress and the annealing of the compressive stress by heat so that neither a tensile stress larger than 1.5 GPa nor a compressive stress larger than −1.5 GPa (larger in the absolute value of the stress) is introduced, the integrated residual stress can be controlled within the range of −1.5 to 1.5 GPa in any region included in the surface region.

Similarly, the substrate bias voltage, the substrate temperature, and the on/off state of the heater can be controlled so that the integrated residual stress of the entire coated layer falls within the range of −1 to less than 0 GPa.

In addition, bombardment before the formation of the coated layer is a step important for improving the coherence between the crystal grains contained in the coated layer and the WC crystal grains contained in the substrate in the interfacial region between the substrate and the coated layer. Specifically, with the substrate bias voltage maintained at −1,500 V after the introduction of argon gas, the surface of the cemented carbide substrate is bombarded while causing a tungsten filament to emit thermal electrons, followed by the formation of the coated layer, so that the crystal grains contained in the coated layer are coherent with the WC crystal grains contained in the substrate in the interfacial region between the substrate and the coated layer.

This is probably because the bombardment removes contaminants and oxidized layer from the surfaces of the WC crystal grains in the interfacial region and increases the activity of the surfaces of the WC crystal grains so that the crystal grains in the coated layer grow so as to be coherent with the WC crystal grains. This improves the coherence between the crystal grains contained in the coated layer and the WC crystal grains contained in the substrate to provide strong adhesion between the coated layer and the WC crystal grains (that is, the substrate), thus realizing superior peeling resistance.

EXAMPLES

The present invention will be described in more detail with reference to the examples below, although the invention is not limited thereto. The compound compositions of coated layers in the examples were examined by an X-ray photoelectron spectrometer (XPS). In addition, the residual stress and the thickness (or the distance from the surface of the coated layer) were measured by the $\sin^2 \psi$ method described above.

In the measurement by the $\sin^2 \psi$ method, the energy of the X-ray used was 10 keV, and the diffraction peaks corresponded to the (200) plane of $Ti_{0.5}Al_{0.5}N$. The positions of the measured diffraction peaks were determined by fitting a Gaussian function, and the gradient of a $2\theta$-$\sin^2 \psi$ graph was determined. The stress was based on a Young's modulus measured using a dynamic hardness tester (Nanoindenter, manufactured by MTS Systems Corporation) and the Poisson's ratio of TiN (0.19).

The coated layers below were formed by cathode arc ion plating, although the coated layers can also be formed by, for example, balanced or unbalanced sputtering.

Examples 1 to 6 and Comparative Examples 1 to 4

The coated layers formed in Examples 1 to 6 below were layers having single compositions, although similar advantages can also be provided using a coated layer having a composition other than those used in these examples, a coated layer formed of two or more layers having different compositions, or a coated layer having a super-multilayered structure in at least part thereof.

Production of Surface-Coated Cutting Tools

First, indexable inserts for cutting (Substrate Nos. 1 and 2) formed of the material and having the tool shape shown in Table I below were prepared as substrates of surface-coated cutting tools (prepared for each method for characteristic evaluation described later), and they were set to a cathode arc ion plating apparatus. The substrates were formed of a cemented carbide and contained WC crystal grains, and the average grain size of the crystal grains (those on the surfaces of the substrates (interfaces with the coated layers)) was as shown in Table I.

TABLE I

|  | Evaluation of wear resistance | Evaluation of breakage resistance |
|---|---|---|
| Substrate No. | No. 1 | No. 2 |
| Material of substrate (JIS) | P20 | P20 |
| Average grain size of WC crystal grains | 4 μm | 4 μm |
| Tool shape | CNMG120408 | CNMG120408 |
| Work | SCM435 | SCM435 (Four grooves) |
| Cutting speed (m/min) | 400 | 100 |
| Feed (mm/rev) | 0.2 | From 0.2 |
| Depth of cut (mm) | 1.5 | 2.0 |
| Cutting fluid | Used | Used |

Subsequently, the internal pressure of a chamber of the apparatus was reduced by a vacuum pump, and the substrate temperature was raised to 450° C. by a heater installed in the apparatus. The chamber was evacuated until the internal pressure thereof reached $1.0 \times 10^{-4}$ Pa.

Next, argon gas was introduced into the chamber to maintain the internal pressure thereof at 3.0 Pa, the voltage of the substrate bias power supply for the substrates was gradually raised to −1,500 V, and the surfaces of the substrates were cleaned for 15 minutes by heating a tungsten filament so that it emitted thermal electrons. The argon gas was exhausted thereafter.

Then, as the coated layer to be formed in direct contact with the substrates, a $Ti_{0.5}Al_{0.5}N$ layer having a thickness of 15 μm was formed using an alloy target, that is, a metal evaporation source set in advance, with nitrogen gas being introduced as a reactant gas at a reactant gas pressure of 4.0 Pa by supplying an arc current of 100 A to the cathode so that metal ions were generated from the arc evaporation source while changing the substrate bias voltage and the substrate temperature as shown in Table II below, thereby producing surface-coated cutting tools of Examples 1 to 6 and Comparative Examples 1 to 4 having the strength distributions of integrated residual stress shown in Table III below.

The surface-coated cutting tools of Comparative Example 1 were produced so as to have a constant compressive stress of −3.0 GPa over the entire region of the coated layer without a strength distribution of integrated residual stress. Similarly, the surface-coated cutting tools of Comparative Example 2 were produced so as to have a constant tensile stress of 1.0 GPa over the entire region of the coated layer without a strength distribution of integrated residual stress. In addition, the surface-coated cutting tools of Comparative Examples 3 and 4 were produced so as to have an integrated residual stress exceeding the range of −1.5 to 1.5 GPa in the surface region of the coated layer.

TABLE II

| No. | Elapsed time; | substrate bias voltage; | temperature |
|---|---|---|---|
| Example 1 | Start to 560 minutes | 560 minutes to 596 minutes | 596 minutes to 600 minutes |
|  | Constant at −100 V | −100 V to −30 V | Constant at −30 V |
|  | Constant at 650° C. | 650° C. to 700° C. | Constant at 700° C. |
| Example 2 | Start to 560 minutes | 560 minutes to 596 minutes | 596 minutes to 600 minutes |
|  | −50 V to −70 V | −70 V to −30 V | Constant at −30 V |
|  | Constant at 600° C. | 600° C. to 700° C. | Constant at 700° C. |
| Example 3 | Start to 560 minutes | 560 minutes to 596 minutes | 596 minutes to 600 minutes |
|  | −30 V to −50 V | 596 minutes | 600 minutes |
|  | 500° C. to 600° C. | −50 V to −30 V | Constant at −30 V |
|  |  | 600° C. to 700° C. | Constant at 700° C. |
| Example 4 | Start to 560 minutes | 560 minutes to 596 minutes | 596 minutes to 600 minutes |
|  | −30 V to −50 V | 596 minutes | 600 minutes |
|  | 500° C. to 600° C. | Constant at −50 V | −50 V to −150 V |
|  |  | 600° C. to 700° C. | Constant at 700° C. |
| Example 5 | Start to 560 minutes | 560 minutes to 598 minutes | 598 minutes to 600 minutes |
|  | −30 V to −40 V | Constant at 550° C. | −40 V to −50 V | −50 V to −75 V |
|  |  | 550° C. to 675° C. | 675° C. to 650° C. |
| Example 6 | Start to 560 minutes | 560 minutes to 598 minutes | 598 minutes to 600 minutes |
|  | Constant at −30 V | Constant at 550° C. | −30 V to −40 V | −40 V to −75 V |
|  |  | 550° C. to 650° C. | Constant at 650° C. |
| Comparative Example 1 | Start to 560 minutes | 560 minutes to 598 minutes | 598 minutes to 600 minutes |
|  | Constant at −100 V | Constant at −100 V | Constant at −100 V |
|  | Constant at 500° C. | Constant at 500° C. | Constant at 500° C. |
| Comparative Example 2 | Start to 560 minutes | 560 minutes to 598 minutes | 598 minutes to 600 minutes |
|  | Constant at −50 V | Constant at −50 V | Constant at −50 V |
|  | Constant at 700° C. | Constant at 700° C. | Constant at 700° C. |
| Comparative Example 3 | Start to 300 minutes | 300 minutes to 560 minutes | 560 minutes to 600 minutes |
|  | Constant at −50 V | −50 V to −30 V | Constant at −30 V |
|  | Constant at 600° C. | 600° C. to 700° C. | Constant at 700° C. |
| Comparative Example 4 | Start to 300 minutes | 300 minutes to 560 minutes | 560 minutes to 600 minutes |
|  | Constant at −50 V | −50 V to −100 V | Constant at −100 V |
|  | Constant at 600° C. | 600° C. to 500° C. | Constant at 500° C. |

The times shown in the above table refer to the times elapsed after the evaporation of metal ions from the alloy target was started. In addition, the values of the voltages shown in the individual columns indicate the substrate (substrate) bias voltages corresponding to the above elapsed times. For example, the range shown as "−30 V to −50 V" means that the substrate bias voltage was gradually increased (increased in absolute value) from −30 V to −50 V at constant speed over the elapsed time. In this case, the integrated residual stress of the coated layer decreases gradually in the direction toward the surface of the coated layer. On the other hand, the range shown as "−50 V to −30 V" means that the substrate bias voltage was gradually decreased (decreased in absolute value) from −50 V to −30 V at constant speed over the elapsed time. In this case, the integrated residual stress of the coated layer increases gradually in the direction toward the surface of the coated layer. In addition, the values of the temperatures shown in the individual columns indicate the substrate temperatures corresponding to the above elapsed times. For example, the range shown as "500° C. to 600° C." means that the temperature was gradually increased from 500° C. to 600° C. at constant speed over the elapsed time. In this case, the integrated residual stress of the coated layer increases gradually in the direction toward the surface of the coated layer. On the other hand, the range shown as "675° C. to 650° C." means that the temperature was gradually decreased from 675° C. to 650° C. at constant speed over the elapsed time. In this case, the integrated residual stress of the coated layer decreases gradually in the direction toward the surface of the coated layer. Maximum and minimum points of the integrated residual stress appear where the change in voltage or temperature shifts from increase to decrease and where the change in voltage or temperature shifts from decrease to increase.

Thus, the substrate bias voltage and the temperature can be changed in association with the elapsed time to vary the integrated residual stress of the coated layer (form a strength distribution). In addition, the residual stress of the coated layer tends to increase as the substrate temperature is raised or the substrate bias voltage is brought closer to 0 V or is decreased to less than −200 V. Specifically, a tensile stress can be induced by raising the substrate temperature to 650° C. or more, increasing the substrate bias voltage to more than −50 V or decreasing it to less than −400 V, or combining these conditions.

grains contained in the substrates in the interfacial regions between the substrates and the coated layers.

It was found that the coated layers of the surface-coated cutting tools, thus produced, of Examples 1 to 6 according to the present invention suffered no failure during the formation of the coated layers, whereas the coated layers of the surface-

TABLE III

| No. | Integrated residual stress at surface | $Z_1$ | Integrated residual stress at point A | $Z_2$ | Integrated residual stress at point B | Overall integrated residual stress |
|---|---|---|---|---|---|---|
| Example 1 | 1.3 GPa | — | 1.3 GPa | 0.2 μm | −1.5 GPa | −1.5 GPa |
| Example 2 | 1.3 GPa | — | 1.3 GPa | 0.2 μm | −1.5 GPa | −1.0 GPa |
| Example 3 | 1.3 GPa | — | 1.3 GPa | 0.2 μm | −1.0 GPa | −0.8 GPa |
| Example 4 | −1.0 GPa | 0.06 μm | 1.0 GPa | 0.2 μm | −1.0 GPa | −0.8 GPa |
| Example 5 | −0.8 GPa | 0.06 μm | 0.8 GPa | 0.1 μm | −0.8 GPa | −0.5 GPa |
| Example 6 | −0.8 GPa | 0.06 μm | 0.5 GPa | 0.1 μm | −0.5 GPa | −0.5 GPa |
| Comparative Example 1 | −3.0 GPa | — | −3.0 GPa | — | −3.0 GPa | −3.0 GPa |
| Comparative Example 2 | 1.0 GPa | — | 1.0 GPa | — | 1.0 GPa | 1.0 GPa |
| Comparative Example 3 | 2.0 GPa | — | 2.0 GPa | 4.0 μm | 2.0 GPa | −1.0 GPa |
| Comparative Example 4 | −2.0 GPa | — | −2.0 GPa | — | −2.0 GPa | −1.0 GPa |

The values shown in the columns of the integrated residual stresses at the surface, point A, and point B in Table III above indicate the integrated residual stresses at the surface of the coated layer (where the point at a thickness of 0.03 μm was assumed to be the surface for convenience because the stress at the outermost surface (point at a thickness of 0 μm) could not be measured), at the point corresponding to point A in FIG. 1 (namely, the maximum point of the integrated residual stress), and at the point corresponding to point B in FIG. 1 (namely, the deepest point of the surface region), respectively. In addition, the values shown in the columns of $Z_1$ and $Z_2$ (which are points where the integrated residual stress is zero, $Z_1$ indicating a point where the compressive stress on the surface side of the coated layer changes to a tensile stress as viewed from the surface side and $Z_2$ indicating a point where the tensile stress on the surface side changes to a compressive stress as viewed from the surface side) indicate the respective distances from the surface of the coated layer (that is, indicate the points corresponding to $Z_1$ and $Z_2$ in FIG. 1). The blanks in the columns of $Z_1$ and $Z_2$ mean that there was no corresponding point. For example, the blanks in the column of $Z_1$, as in Examples 1 to 3, mean that the integrated residual stress was substantially constant from the surface of the coated layer to point A.

In addition, the values shown in the column of the integrated residual stresses of the entire coated layers indicate the integrated residual stresses of the entire coated layers.

Thus, the surface-coated cutting tools of Examples 1 to 6 according to the present invention include a substrate and a coated layer formed on the substrate, and the coated layer is a physical-vapor-deposition layer having a thickness of 10 μm or more. A surface region having a thickness of 1 μm from a surface of the coated layer includes a first region whose integrated residual stress is a compressive stress and a second region whose integrated residual stress is a tensile stress, and the integrated residual stress of the surface region falls within the range of −1.5 to 1.5 GPa in any region included in the surface region. In addition, it was found that the crystal grains contained in the coated layers of the surface-coated cutting tools of these examples were coherent with the WC crystal coated cutting tools of Comparative Examples 1 and 2 partially suffered a failure during the formation of the coated layers.

Evaluation of Wear Resistance of Surface-Coated Cutting Tools

The surface-coated cutting tools, produced as above, of Examples 1 to 6 and Comparative Examples 1 to 4 were evaluated for wear resistance by continuous wet cutting (using a cutting fluid (aqueous emulsion)) under the conditions shown in Table I above. The evaluation was carried out by measuring the time at which the width of flank wear at the cutting edge exceeded 0.2 mm as the cutting time.

As the results of the evaluation of the surface-coated cutting tools for wear resistance, the cutting times, measured as above, are shown in Table IV below, where a longer cutting time indicates a higher wear resistance. In the continuous cutting, additionally, the presence or absence of gloss on the finished surfaces of the works was observed, and the observation results are shown in Table IV, where "glossy" means that the finished surface of the work was glossy and "cloudy" means that the finished surface of the work was cloudy without gloss.

As is obvious from Table IV, it was found that the surface-coated cutting tools of Examples 1 to 6 according to the present invention had a higher resistance to film chipping (failure in the coated layer during cutting) than the surface-coated cutting tools of Comparative Examples 1 to 4 because the wear resistance was improved and the finished surface was glossy and also that the life of the surface-coated cutting tools was improved.

Evaluation of Breakage Resistance of Surface-Coated Cutting Tools

The surface-coated cutting tools, produced as above, of Examples 1 to 6 and Comparative Examples 1 to 4 were evaluated for breakage resistance under the conditions shown below.

Specifically, the cutting conditions were such that dry turning was performed using a round bar (with a length of 500 mm and a diameter of 200 mm) of SCM435 having four slits, as shown in Table I above, as a work at a cutting speed of 100 m/min and a depth of cut of 2.0 mm with the feed per revolution increased from 0.20 mm/rev in increments of 0.05 mm/rev every 30 seconds during the cutting time to measure the maximum feed at which a breakage occurred.

As the results of the evaluation of the surface-coated cutting tools for breakage resistance, the maximum feeds, measured as above, are shown in Table IV below, where a larger maximum feed indicates a higher breakage resistance.

As is obvious from Table IV, it was found that the surface-coated cutting tools of Examples 1 to 6 according to the present invention had a higher breakage resistance than the surface-coated cutting tools of Comparative Examples 1 to 4.

TABLE IV

| No. | Evaluation of wear resistance | Evaluation of breakage resistance |
| --- | --- | --- |
| Example 1 | 23 minutes (glossy) | 0.25 mm/rev |
| Example 2 | 26 minutes (glossy) | 0.23 mm/rev |
| Example 3 | 31 minutes (glossy) | 0.29 mm/rev |
| Example 4 | 33 minutes (glossy) | 0.33 mm/rev |
| Example 5 | 37 minutes (glossy) | 0.35 mm/rev |
| Example 6 | 39 minutes (glossy) | 0.38 mm/rev |
| Comparative Example 1 | Note 1 | Note 1 |
| Comparative Example 2 | 18 minutes (cloudy) | Immediately broke |
| Comparative Example 3 | 16 minutes (cloudy) | Immediately broke |
| Comparative Example 4 | Note 1 | Note 1 |

Note 1:
The evaluation could not be performed because the coated layer suffered a failure at the cutting edge during the formation of the coated layer.

Examples 7 to 12 and Comparative Examples 5 to 10

As substrates of surface-coated cutting tools, two types of cemented carbide substrates having the composition WC-2TaC-0.7Cr$_3$C$_2$-7Co (where the numbers are expressed in percent by weight, the balance being WC) and containing WC crystal grains having different grain sizes (the WC crystal grains in Examples 7, 9, and 11 had an average grain size of 1.2 μm and those in Examples 8, 10, and 12 had an average grain size of 3.5 μm) were prepared (one prepared for each method for characteristic evaluation described later). The substrates were prepared as indexable inserts for cutting having the same tool shape as that shown in Table I. These substrates were set to a cathode arc ion plating apparatus.

Subsequently, the internal pressure of a chamber of the apparatus was reduced by a vacuum pump while the substrate temperature was raised to 450° C. by a heater installed in the apparatus. The chamber was evacuated until the internal pressure thereof reached $1.0 \times 10^{-4}$ Pa. Argon gas was then introduced into the chamber to maintain the internal pressure thereof at 3.0 Pa, the voltage of the substrate bias power supply for the substrates was gradually raised to −1,500 V, and the surfaces of the substrates were cleaned for 15 minutes by heating a tungsten filament so that it emitted thermal electrons. The argon gas was exhausted thereafter.

Then, as the coated layer to be formed in direct contact with the substrates, Ti$_{0.95}$Hf$_{0.05}$N layers and Al$_{0.7}$Cr$_{0.3}$N layers were deposited alternately on top of each other, each having a thickness of 10 nm, thus forming a super-multilayered-structure layer (such that a Ti$_{0.95}$Hf$_{0.05}$N layer was formed on the substrates), and an outermost layer of Ti$_{0.95}$Hf$_{0.05}$CN having a thickness of 5.5 μm was formed thereon. The thickness of the super-multilayered-structure layer was 5 μm in Examples 7 and 8, 10 μm in Examples 9 and 10, and 15 μm in Examples 11 and 12. This coated layer was formed as follows.

Specifically, after the setting of alloy targets, that is, metal evaporation sources, the coated layer was formed with nitrogen gas and methane gas being introduced as reactant gases at a reactant gas pressure of 4.0 Pa (the methane gas was introduced only during the formation of the outermost layers) by supplying an arc current of 100 A to the cathode so that metal ions were generated from the arc evaporation sources while changing the substrate bias voltage and the substrate temperature as shown in Table V below (where the column in which the elapsed time is "Start to" shows the conditions where the super-multilayered-structure layer was formed), thereby producing surface-coated cutting tools of Examples 7 to 12 having the strength distributions of integrated residual stress shown in Table VI below.

For comparison, additionally, two types of cemented carbide substrates having the composition WC-2TaC-0.7Cr$_3$C$_2$-7Co (where the numbers are expressed in percent by weight, the balance being WC) and containing WC crystal grains having different grain sizes (the WC crystal grains in Comparative Examples 5, 7, and 9 had an average grain size of 1.2 μm and those in Comparative Examples 6, 8, and 10 had an average grain size of 3.5 μm) were prepared as substrates (one prepared for each method for characteristic evaluation described later), and a coated layer including an alumina layer having a thickness of 5.5 μm as the outermost layer and a TiCN layer as the underlying layer was formed on the substrates by a known chemical vapor deposition process, thus producing surface-coated cutting tools of Comparative Examples 5 to 10. The thickness of the underlying TiCN layer was 5 μm in Comparative Examples 5 and 6, 10 μm in Comparative Examples 7 and 8, and 15 μm in Comparative Examples 9 and 10.

TABLE V

| No. | Elapsed time; substrate bias voltage; temperature | | |
| --- | --- | --- | --- |
| Examples 7 and 8 | Start to 320 minutes<br>Constant at −300 V<br>Constant at 700° C. | 320 minutes to 390 minutes<br>Constant at −300 V<br>Constant at 700° C. to 650° C. | 390 minutes to 400 minutes<br>Constant at −300 V<br>Constant at 650° C. |
| Examples 9 and 10 | Start to 520 minutes<br>Constant at −300 V<br>Constant at 700° C. | 520 minutes to 590 minutes<br>Constant at −300 V<br>Constant at 700° C. to 650° C. | 590 minutes to 600 minutes<br>Constant at −300 V<br>Constant at 650° C. |
| Examples 11 and 12 | Start to 720 minutes<br>Constant at −300 V<br>Constant at 700° C. | 720 minutes to 790 minutes<br>Constant at −300 V<br>Constant at 700° C. to 650° C. | 790 minutes to 800 minutes<br>Constant at −300 V<br>Constant at 650° C. |

TABLE VI

| No. | Integrated residual stress at surface | $Z_1$ | Integrated residual stress at point A | $Z_2$ | Integrated residual stress at point B | Overall integrated residual stress |
|---|---|---|---|---|---|---|
| Examples 7 and 8 | 0.8 GPa | — | — | 0.3 μm | −0.75 GPa | −1.0 GPa |
| Examples 9 and 10 | 0.8 GPa | — | — | 0.3 μm | −0.75 GPa | −1.0 GPa |
| Examples 11 and 12 | 0.8 GPa | — | — | 0.3 μm | −0.75 GPa | −1.0 GPa |
| Comparative Examples 5 to 10 | 0.5 GPa | — | — | — | 0.5 GPa | 0.5 GPa |

The notation of Tables V and VI follows that of Tables II and III. Table VI shows that the surface-coated cutting tools of Examples 7 to 12 had no points corresponding to $Z_1$ and point A in FIG. 1 and that the region from the surface to the point corresponding to $Z_2$ was a second region and the region from the point corresponding to $Z_2$ to the point corresponding to point B was a first region.

Thus, the surface-coated cutting tools of Examples 7 to 12 according to the present invention include a substrate and a coated layer formed on the substrate, and the coated layer is a physical-vapor-deposition layer having a thickness of 10 μm or more. A surface region having a thickness of 1 μm from a surface of the coated layer includes a first region whose integrated residual stress is a compressive stress and a second region whose integrated residual stress is a tensile stress, and the integrated residual stress of the surface region falls within the range of −1.5 to 1.5 GPa in any region included in the surface region. In addition, it was found that the crystal grains contained in the coated layers of the surface-coated cutting tools of these examples were coherent with the WC crystal grains contained in the substrates in the interfacial regions between the substrates and the coated layers.

The surface-coated cutting tools, produced as above, of Examples 7 to 12 and Comparative Examples 5 to 10 were evaluated for wear resistance and breakage resistance under the same conditions as those shown in Table I above. The results are shown in Table VII.

TABLE VII

| No. | Evaluation of wear resistance | Evaluation of breakage resistance |
|---|---|---|
| Example 7 | 41 minutes (glossy) | 0.48 mm/rev |
| Example 8 | 32 minutes (glossy) | 0.43 mm/rev |
| Example 9 | 51 minutes (glossy) | 0.45 mm/rev |
| Example 10 | 44 minutes (glossy) | 0.41 mm/rev |
| Example 11 | 78 minutes (glossy) | 0.40 mm/rev |
| Example 12 | 59 minutes (glossy) | 0.35 mm/rev |
| Comparative Example 5 | 30 minutes (glossy) | Immediately broke |
| Comparative Example 6 | 31 minutes (glossy) | Immediately broke |
| Comparative Example 7 | 29 minutes (cloudy) | Immediately broke |
| Comparative Example 8 | 28 minutes (cloudy) | Immediately broke |
| Comparative Example 9 | 24 minutes (cloudy) | Immediately broke |
| Comparative Example 10 | 26 minutes (cloudy) | Immediately broke |

As is obvious from Table VII, it was found in the evaluation of wear resistance (continuous cutting test) and the evaluation of breakage resistance (interrupted cutting test) that the surface-coated cutting tools of Examples 7, 9, and 11, where the WC crystal grains had an average grain size of 1.2 μm, had a higher wear resistance and breakage resistance than the surface-coated cutting tools of Examples 8, 10, and 12, where the WC crystal grains had an average grain size of 3.5 μm.

In addition, the surface-coated cutting tools of Examples 11 and 12 (the total thickness of the coated layer was 20.5 μm) had a higher wear resistance than the surface-coated cutting tools of Examples 9 and 10 (the total thickness of the coated layer was 15.5 μm), and the surface-coated cutting tools of Examples 9 and 10 (the total thickness of the coated layer was 15.5 μm) had a higher wear resistance than the surface-coated cutting tools of Examples 7 and 8 (the total thickness of the coated layer was 10.5 μm). Nevertheless, it was found that any of the surface-coated cutting tools of the examples had a higher wear resistance and breakage resistance than the surface-coated cutting tools of Comparative Examples 5 to 10. In particular, it was found that the surface-coated cutting tools of Examples 9 and 10, where the total thickness of the coated layer was 15.5 μm, and the surface-coated cutting tools of Examples 11 and 12, where the total thickness of the coated layer was 20.5 μm, had a particularly higher wear resistance and breakage resistance than the surface-coated cutting tools of the comparative examples where the coated layers had the same thicknesses.

Examples 13 to 15 and Comparative Example 11

Production of Surface-Coated Cutting Tools

First, indexable inserts for cutting (Substrate Nos. 1 and 2) formed of the material and having the tool shape shown in Table I above were prepared as substrates of surface-coated cutting tools (prepared for each method for characteristic evaluation described later), and they were set to a cathode arc ion plating apparatus. The substrates were formed of a cemented carbide and contained WC crystal grains, and the average grain size of the crystal grains (those on the surfaces of the substrates (interfaces with the coated layers)) was as shown in Table I.

Subsequently, the internal pressure of a chamber of the apparatus was reduced by a vacuum pump while the substrate temperature was raised to 450° C. by a heater installed in the apparatus. The chamber was evacuated until the internal pressure thereof reached $1.0 \times 10^{-4}$ Pa.

Next, argon gas was introduced into the chamber to maintain the internal pressure thereof at 3.0 Pa, the voltage of the substrate bias power supply for the substrates was gradually raised to −1,500 V, and the surfaces of the substrates were cleaned for 15 minutes by heating a tungsten filament so that it emitted thermal electrons. The argon gas was exhausted thereafter.

Then, as the coated layer to be formed in direct contact with the substrates, a $Ti_{0.5}Al_{0.5}N$ layer having a thickness of 10 μm was formed on the substrates using an alloy target, that is, a metal evaporation source set in advance, with nitrogen gas being introduced as a reactant gas at a deposition pressure of 4.0 Pa, a substrate bias voltage of −30 V, and a substrate temperature of 550° C. by supplying an arc current of 150 A to the cathode so that metal ions of titanium and aluminum were generated from the arc evaporation source.

Next, a $TiC_{0.2}N_{0.8}$ layer having a thickness of 5 μm was also formed as the coated layer on the $Ti_{0.5}Al_{0.5}N$ layer using an arc evaporation source of metallic titanium set in advance. The $TiC_{0.2}N_{0.8}$ layer was formed on the previously formed $Ti_{0.5}Al_{0.5}N$ layer with methane and nitrogen being introduced as reactant gases in a ratio of 1:4 at a deposition pressure of 4.0 Pa by supplying an arc current of 180 A to the cathode so that metal ions of titanium were generated from the arc evaporation source while changing the substrate bias voltage and the substrate temperature as shown in Table VIII. To form the $TiC_{0.2}N_{0.8}$ layer, the substrates may be temporarily removed from the vacuum furnace after the formation of the $Ti_{0.5}Al_{0.5}N$ layer, or the $TiC_{0.2}N_{0.8}$ layer may be continuously formed in the same vacuum furnace.

Produced by the above deposition procedure were surface-coated cutting tools of Examples 13 to 15 and Comparative Example 11 having the strength distributions of integrated residual stress shown in Table IX. The surface-coated cutting tools of Comparative Example 11 had a constant tensile stress of 0.5 GPa without a strength distribution of integrated residual stress in the coated layer. The strength distributions of integrated residual stress shown in Table IX relate to the $TiC_{0.2}N_{0.8}$ layer (hence, "Overall integrated residual stress" indicates the integrated residual stress of the entire $TiC_{0.2}N_{0.8}$ layer). In Example 15, the substrate bias voltage was increased from −400 V to −600 V (increased in absolute value). The integrated residual stress of a $TiC_{0.2}N_{0.8}$ layer shifts to the compressive stress side as the substrate bias voltage is increased from 0 V to −200 V (increased in absolute value). As the substrate bias voltage is further increased to −200 V or more (increased in absolute value), the compressive stress decreases and shifts to the tensile stress side. Thus, in Example 15, a tensile stress was applied by increasing the absolute value of the substrate bias voltage.

TABLE VIII

| No. | Elapsed time; substrate bias voltage; temperature | | |
|---|---|---|---|
| Example 13 | Start to 150 minutes<br>Constant at 30 V<br>560° C. to 620° C. | 150 minutes to<br>180 minutes<br>Constant at 30 V<br>620° C. to 650° C. | 180 minutes to<br>200 minutes<br>Constant at 30 V<br>Constant at 650° C. |
| Example 14 | Start to 150 minutes<br>Constant at 30 V<br>560° C. to 650° C. | 150 minutes to<br>180 minutes<br>30 V to 25 V<br>Constant at 650° C. | 180 minutes to<br>200 minutes<br>Constant at 25 V<br>Constant at 650° C. |
| Example 15 | Start to 150 minutes<br>Constant at −400 V<br>Constant at 560° C. | 150 minutes to<br>180 minutes<br>−400 V to −600 V<br>Constant at 650° C. | 180 minutes to<br>200 minutes<br>Constant at −600 V<br>Constant at 650° C. |
| Comparative Example 11 | Start to 150 minutes<br>Constant at −600 V<br>Constant at 700° C. | 150 minutes to<br>180 minutes<br>Constant at −600 V<br>Constant at 700° C. | 180 minutes to<br>200 minutes<br>Constant at −600 V<br>Constant at 700° C. |

The notation of Tables VIII and IX follows that of Tables II and III.

Thus, the surface-coated cutting tools of Examples 13 to 15 according to the present invention include a substrate and a coated layer formed on the substrate, and the coated layer is a physical-vapor-deposition layer having a thickness of 10 μm or more. A surface region having a thickness of 1 μm from a surface of the coated layer includes a first region whose integrated residual stress is a compressive stress and a second region whose integrated residual stress is a tensile stress, and the integrated residual stress of the surface region falls within the range of −1.5 to 1.5 GPa in any region included in the surface region. In addition, it was found that the crystal grains contained in the coated layers of the surface-coated cutting tools of these examples were coherent with the WC crystal grains contained in the substrates in the interfacial regions between the substrates and the coated layers.

The surface-coated cutting tools, produced as above, of Examples 13 to 15 and Comparative Example 11 were evaluated as above for wear resistance and breakage resistance under the same conditions as those shown in Table I above. The results are shown in Table X. The notation of Table X follows that of Table IV.

TABLE X

| No. | Evaluation of wear resistance | Evaluation of breakage resistance |
|---|---|---|
| Example 13 | 52 minutes (glossy) | 0.23 mm/rev |
| Example 14 | 45 minutes (glossy) | 0.21 mm/rev |
| Example 15 | 48 minutes (glossy) | 0.23 mm/rev |
| Comparative Example 11 | 19 minutes (cloudy) | Immediately broke |

As is obvious from Table X, it was found that the surface-coated cutting tools of Examples 13 to 15 according to the present invention had a higher resistance to film chipping (failure in the coated layer during cutting) than the surface-coated cutting tool of Comparative Example 11 because the wear resistance was improved and the finished surface was glossy and also that the life of the surface-coated cutting tools was improved. Also, as is obvious from Table X, it was found that the surface-coated cutting tools of Examples 13 to 15 according to the present invention had a higher breakage resistance than the surface-coated cutting tool of Comparative Example 11.

Examples 16 to 20 and Comparative Examples 12 to 16

Production of Surface-Coated Cutting Tools

First, indexable inserts for cutting (Substrate Nos. 1 and 2) formed of the material and having the tool shape shown in

TABLE IX

| No. | Integrated residual stress at surface | $Z_1$ | Integrated residual stress at point A | $Z_2$ | Integrated residual stress at point B | Overall integrated residual stress |
|---|---|---|---|---|---|---|
| Example 13 | 1.0 GPa | — | 1.0 GPa | 0.15 μm | −1.4 GPa | −1.3 GPa |
| Example 14 | 1.3 GPa | — | 1.3 GPa | 0.15 μm | −1.2 GPa | −1.0 GPa |
| Example 15 | 0.5 GPa | — | 0.5 GPa | 0.15 μm | −1.5 GPa | −1.3 GPa |
| Comparative Example 11 | 0.5 GPa | — | 0.5 GPa | — | 0.5 GPa | 0.5 GPa |

Table I above were prepared as substrates of surface-coated cutting tools (prepared for each method for characteristic evaluation described later), and they were set to a cathode arc ion plating apparatus. The substrates were formed of a cemented carbide and contained WC crystal grains, and the average grain size of the crystal grains (those on the surfaces of the substrates (interfaces with the coated layers)) was as shown in Table I.

Subsequently, the internal pressure of a chamber of the apparatus was reduced by a vacuum pump while the substrate temperature was raised to 450° C. by a heater installed in the apparatus. The chamber was evacuated until the internal pressure thereof reached $1.0 \times 10^{-4}$ Pa.

Next, argon gas was introduced into the chamber to maintain the internal pressure thereof at 3.0 Pa, the voltage of the substrate bias power supply for the substrates was gradually raised to −1,500 V, and the surfaces of the substrates were cleaned for 15 minutes by heating a tungsten filament so that it emitted thermal electrons. The argon gas was exhausted thereafter.

Then, as the coated layer to be formed in direct contact with the substrates, a $Ti_{0.9}Ta_{0.1}N$ layer, a $Ti_{0.95}Hf_{0.05}N$ layer, a $Ti_{0.95}Nb_{0.05}N$ layer, a $Ti_{0.93}Si_{0.07}N$ layer, and a TN layer, each having a thickness of 13 μm, were formed using alloy targets, that is, metal evaporation sources set in advance, with nitrogen gas being introduced as a reactant gas at a pressure of 4.0 Pa while changing the substrate bias voltage and the substrate temperature as shown in Table XI, thereby producing surface-coated cutting tools of Examples 16 to 20. On the other hand, the surface-coated cutting tools of Comparative Examples 12 to 16 were produced at a deposition pressure of 5 Pa and at a constant substrate bias voltage and a constant substrate temperature. In both the examples and the comparative examples, metal ions were generated from the arc evaporation sources by supplying an arc current of 120 A to the cathode.

The surface-coated cutting tools of these examples and comparative examples had the strength distributions of integrated residual stress shown in Table XII.

TABLE XI

| No. | Type of film | Elapsed time; substrate bias voltage; temperature | | |
|---|---|---|---|---|
| Example 16 | $Ti_{0.9}Ta_{0.1}N$ | Start to 470 minutes −30 V to −50 V 500° C. to 600° C. | 470 minutes to 496 minutes −50 V to −25 V 600° C. to 650° C. | 496 minutes to 500 minutes Constant at −25 V Constant at 650° C. |
| Example 17 | $Ti_{0.95}Hf_{0.05}N$ | Start to 470 minutes −30 V to −50 V 500° C. to 600° C. | 470 minutes to 496 minutes −50 V to −25 V 600° C. to 650° C. | 496 minutes to 500 minutes Constant at −25 V Constant at 650° C. |
| Example 18 | $Ti_{0.95}Nb_{0.05}N$ | Start to 470 minutes −30 V to −50 V 500° C. to 600° C. | 470 minutes to 496 minutes −50 V to −25 V 600° C. to 650° C. | 496 minutes to 500 minutes Constant at −25 V Constant at 650° C. |
| Example 19 | $Ti_{0.93}Si_{0.07}N$ | Start to 470 minutes −30 V to −50 V 500° C. to 600° C. | 470 minutes to 496 minutes −50 V to −25 V 600° C. to 650° C. | 496 minutes to 500 minutes Constant at −25 V Constant at 650° C. |
| Example 20 | TiN | Start to 470 minutes −30 V to −50 V 500° C. to 600° C. | 470 minutes to 496 minutes −50 V to −25 V 600° C. to 650° C. | 496 minutes to 500 minutes Constant at −25 V Constant at 650° C. |
| Comparative Example 12 | $Ti_{0.9}Ta_{0.1}N$ | Start to 470 minutes Constant at −30 V Constant at 650° C. | 470 minutes to 496 minutes Constant at −30 V Constant at 650° C. | 496 minutes to 500 minutes Constant at −30 V Constant at 650° C. |
| Comparative Example 13 | $Ti_{0.95}Hf_{0.05}N$ | Start to 470 minutes Constant at −30 V Constant at 650° C. | 470 minutes to 496 minutes Constant at −30 V Constant at 65° C. | 496 minutes to 500 minutes Constant at −30 V Constant at 650° C. |
| Comparative Example 14 | $Ti_{0.95}Nb_{0.05}N$ | Start to 470 minutes Constant at −30 V Constant at 650° C. | 470 minutes to 496 minutes Constant at −30 V Constant at 650° C. | 496 minutes to 500 minutes Constant at −30 V Constant at 650° C. |
| Comparative Example 15 | $Ti_{0.93}Si_{0.07}N$ | Start to 470 minutes Constant at −30 V Constant at 650° C. | 470 minutes to 496 minutes Constant at −30 V Constant at 650° C. | 496 minutes to 500 minutes Constant at −30 V Constant at 650° C. |
| Comparative Example 16 | TiN | Start to 470 minutes Constant at −30 V Constant at 650° C. | 470 minutes to 496 minutes Constant at −30 V Constant at 650° C. | 496 minutes to 500 minutes Constant at −30 V Constant at 650° C. |

TABLE XII

| No. | Integrated residual stress at surface | $Z_1$ | Integrated residual stress at point A | $Z_2$ | Integrated residual stress at point B | Overall integrated residual stress |
|---|---|---|---|---|---|---|
| Example 16 | 1.3 GPa | — | 1.3 GPa | 0.2 μm | −1.4 GPa | −1.3 GPa |
| Example 17 | 1.3 GPa | — | 1.3 GPa | 0.2 μm | −1.4 GPa | −1.3 GPa |
| Example 18 | 1.3 GPa | — | 1.3 GPa | 0.2 μm | −1.2 GPa | −1.1 GPa |
| Example 19 | 1.3 GPa | — | 1.3 GPa | 0.2 μm | −1.4 GPa | −1.3 GPa |

TABLE XII-continued

| No. | Integrated residual stress at surface | $Z_1$ | Integrated residual stress at point A | $Z_2$ | Integrated residual stress at point B | Overall integrated residual stress |
|---|---|---|---|---|---|---|
| Example 20 | 1.3 GPa | — | 1.3 GPa | 0.2 μm | −1.2 GPa | −1.1 GPa |
| Comparative Example 12 | 0.2 GPa | — | 0.2 GPa | — | 0.2 GPa | 0.2 GPa |
| Comparative Example 13 | 0.2 GPa | — | 0.2 GPa | — | 0.2 GPa | 0.2 GPa |
| Comparative Example 14 | 0.1 GPa | — | 0.1 GPa | — | 0.1 GPa | 0.1 GPa |
| Comparative Example 15 | 0.1 GPa | — | 0.1 GPa | — | 0.1 GPa | 0.1 GPa |
| Comparative Example 16 | 0.1 GPa | — | 0.1 GPa | — | 0.1 GPa | 0.1 GPa |

The notation of Tables XI and XII follows that of Tables II and III. In Table XI, "Type of film" indicates the types of compounds forming the coated layers formed as above.

Thus, the surface-coated cutting tools of Examples 16 to 20 according to the present invention include a substrate and a coated layer formed on the substrate, and the coated layer is a physical-vapor-deposition layer having a thickness of 10 μm or more. A surface region having a thickness of 1 μm from a surface of the coated layer includes a first region whose integrated residual stress is a compressive stress and a second region whose integrated residual stress is a tensile stress, and the integrated residual stress of the surface region falls within the range of −1.5 to 1.5 GPa in any region included in the surface region. In addition, it was found that the crystal grains contained in the coated layers of the surface-coated cutting tools of these examples were coherent with the WC crystal grains contained in the substrates in the interfacial regions between the substrates and the coated layers.

The surface-coated cutting tools, produced as above, of Examples 16 to 20 and Comparative Examples 12 to 16 were evaluated as above for wear resistance and breakage resistance under the same conditions as those shown in Table I above. The results are shown in Table XIII. The notation of Table XIII follows that of Table IV.

TABLE XIII

| No. | Evaluation of wear resistance | Evaluation of breakage resistance |
|---|---|---|
| Example 16 | 34 minutes (glossy) | 0.23 mm/rev |
| Example 17 | 34 minutes (glossy) | 0.23 mm/rev |
| Example 18 | 28 minutes (glossy) | 0.21 mm/rev |
| Example 19 | 29 minutes (glossy) | 0.26 mm/rev |
| Example 20 | 23 minutes (glossy) | 0.20 mm/rev |
| Comparative Example 12 | 17 minutes (cloudy) | Immediately broke |
| Comparative Example 13 | 16 minutes (cloudy) | Immediately broke |
| Comparative Example 14 | 15 minutes (cloudy) | Immediately broke |
| Comparative Example 15 | 17 minutes (cloudy) | Immediately broke |
| Comparative Example 16 | 12 minutes (cloudy) | Immediately broke |

As is obvious from Table XIII, it was found that the surface-coated cutting tools of Examples 16 to 20 according to the present invention had a higher resistance to film chipping (failure in the coated layer during cutting) than the surface-coated cutting tools of Comparative Examples 12 to 16 because the wear resistance was improved and the finished surface was glossy and also that the life of the surface-coated cutting tools was improved. Also, as is obvious from Table XIII, it was found that the surface-coated cutting tools of Examples 16 to 20 according to the present invention had a higher breakage resistance than the surface-coated cutting tools of Comparative Examples 12 to 16.

While the embodiments and examples of the present invention have been described above, the configurations of the above embodiments and examples are to be combined as needed.

The embodiments and examples disclosed herein should be construed as being illustrative, rather than as being limitative, in every respect. The scope of the present invention is defined by the claims rather than by the above description, and it is intended that all modifications within the meaning and scope of the claims and equivalents thereof be encompassed.

The invention claimed is:

1. A surface-coated cutting tool comprising:
   a substrate; and
   a coated layer formed on the substrate,
   wherein the coated layer is a physical-vapor-deposition layer having a thickness of 10 μm or more;
   wherein the coated layer has a surface region having a thickness of 1 μm from a surface of the coated layer, the surface region includes a first region whose integrated residual stress is a compressive stress and a second region whose integrated residual stress is a tensile stress;
   wherein the integrated residual stress of the surface region falls within the range of −1.5 to 1.5 GPa in any region included in the surface region, and
   wherein the surface region includes a region from the surface of the coated layer to a thickness of 0.3 μm or less that includes a point $Z_2$, wherein the point $Z_2$ indicates a point where the tensile stress on the surface side changes to a compressive stress as viewed from the surface side.

2. The surface-coated cutting tool according to claim 1, wherein the integrated residual stress of the entire coated layer is −1 to less than 0 GPa.

3. The surface-coated cutting tool according to claim 1, wherein the integrated residual stress of the second region is 1 GPa or less.

4. The surface-coated cutting tool according to claim 1, wherein the coated layer has a thickness of 15 μm or more.

5. The surface-coated cutting tool according to claim 1, wherein the coated layer has a thickness of 20 μm or more.

6. The surface-coated cutting tool according to claim 1, wherein the coated layer includes one or more layers; and at least one of the layers is formed of a nitride, carbonitride, oxynitride, or oxycarbonitride containing at least titanium as a constituent.

7. The surface-coated cutting tool according to claim 1, wherein at least part of the coated layer includes a super-multilayered structure.

8. The surface-coated cutting tool according to claim 1, wherein the substrate is formed of a cemented carbide; the cemented carbide contains WC crystal grains; and the crystal grains have an average grain size of 0.3 to 2.5 μm.

9. The surface-coated cutting tool according to claim 8, wherein crystal grains contained in the coated layer are coherent with the WC crystal grains contained in the substrate in an interfacial region between the substrate and the coated layer.

10. The surface-coated cutting tool according to claim 1, wherein the surface-coated cutting tool is used for turning.

11. The surface-coated cutting tool according to claim 1, wherein the surface region of the coated layer is a continuous layer of material extending from the surface of the coated layer to at least a depth of 1 μm.

12. A surface-coated cutting tool comprising:
a substrate; and
a coated layer formed on the substrate,
wherein the coated layer is a physical-vapor-deposition layer having a thickness of 10 μm or more;
wherein the coated layer has a surface region having a thickness of 1 μm from a surface of the coated layer, the surface region includes a first region whose integrated residual stress is a compressive stress and a second region whose integrated residual stress is a tensile stress;
wherein the integrated residual stress of the surface region falls within the range of −1.5 to 1.5 GPa in any region included in the surface region, and
wherein the surface region of the coated layer includes a point, at a first depth of 0.3 μm or less from the surface of the coated region, at which the integrated residual stress changes from the tensile stress to the compressive stress.

13. The surface-coated cutting tool according to claim 12, wherein the surface region of the coated layer is a continuous layer of material extending from the surface of the coated layer to at least a depth of 1 μm.

14. The surface-coated cutting tool according to claim 12, wherein the surface region of the coated layer is formed only of a layer having a single composition.

15. The surface-coated cutting tool according to claim 12, wherein the surface region of the coated layer is formed of a layer having a same composition in the first and second regions.

16. The surface-coated cutting tool according to claim 12, wherein the surface region includes another point, at a second depth located between the surface of the coated region and the first depth, at which the integrated residual stress changes from the compressive stress to the tensile stress.

17. The surface-coated cutting tool according to claim 16, wherein second depth is at 0.1 μm or less from the surface of the coated region.

18. The surface-coated cutting tool according to claim 17, wherein the first region includes a first area extending from the surface of the coated region to the another point at the second depth, and a second area extending from the point at the first depth to the bottom of the surface region, and
wherein the second region includes a first area that extends from the another point at the second depth to the point at the first depth.

19. The surface-coated cutting tool according to claim 18, wherein the integrated residual stress of the second region is −1.5 GPa or more, and wherein the integrated residual stress of the second region is 1 GPa or less.

20. The surface-coated cutting tool according to claim 18, wherein the integrated residual stress of the second region is −1.0 GPa or more, and wherein the integrated residual stress of the second region is 0.8 GPa or less.

* * * * *